(12) United States Patent
Chang

(10) Patent No.: US 7,173,290 B2
(45) Date of Patent: Feb. 6, 2007

(54) THYRISTOR SWITCH WITH TURN-OFF CURRENT SHUNT, AND OPERATING METHOD

(75) Inventor: Hsueh-Rong Chang, Thousand Oaks, CA (US)

(73) Assignee: Teledyne Licensing, LLC, Thousand Oaks, CA (US)

( * ) Notice: Subject to any disclaimer, the term of this patent is extended or adjusted under 35 U.S.C. 154(b) by 0 days.

(21) Appl. No.: 10/642,085

(22) Filed: Aug. 15, 2003

(65) Prior Publication Data
US 2004/0173813 A1 Sep. 9, 2004

Related U.S. Application Data

(63) Continuation-in-part of application No. 10/383,598, filed on Mar. 7, 2003, now Pat. No. 6,965,131.

(51) Int. Cl.
*H01L 29/74* (2006.01)
*H01L 31/111* (2006.01)

(52) U.S. Cl. ............... 257/107; 257/133; 257/135; 257/136; 257/138; 257/139; 257/140; 257/146; 257/147

(58) Field of Classification Search ............ 257/107, 257/133, 146–147, 153, 159, 577, 138–140, 257/135, 136
See application file for complete search history.

(56) References Cited

U.S. PATENT DOCUMENTS

| 4,963,950 A | * | 10/1990 | Chang et al. ............... 257/138 |
| 5,324,967 A | | 6/1994 | Honwa et al. |
| 5,329,142 A | | 7/1994 | Kitagawa et al. .......... 257/139 |
| 5,471,075 A | | 11/1995 | Shekar et al. |
| 5,977,570 A | * | 11/1999 | Takahashi et al. .......... 257/136 |
| 6,392,273 B1 | | 5/2002 | Chang ...................... 257/330 |
| 6,399,998 B1 | | 6/2002 | Chang ...................... 257/565 |

OTHER PUBLICATIONS

Kaushik Rajashekara, *Power Semiconductor Devices*, The Electrical Engineering Handbook, Richard C. Dorf, CRE Press, pp. 763-769.

* cited by examiner

*Primary Examiner*—Thien F. Tran
(74) *Attorney, Agent, or Firm*—Koppel, Patrick & Heybl

(57) ABSTRACT

A semiconductor switch includes a thyristor and a current shunt, preferably a transistor in parallel with and controlled by the thyristor, which shunts thyristor current at turn-off. The thyristor includes a portion of a bottom drift layer, with a p-n junction formed below a gate adjacent to the bottom drift layer to establish a depletion region with a high potential barrier to thyristor current flow at turn-off. The bottom drift layer also provides the transistor base, as well as a current path allowing the transistor base current to be controlled by the thyristor. The switch is voltage-controlled device using an insulated gate for turn-on and turn-off.

18 Claims, 3 Drawing Sheets

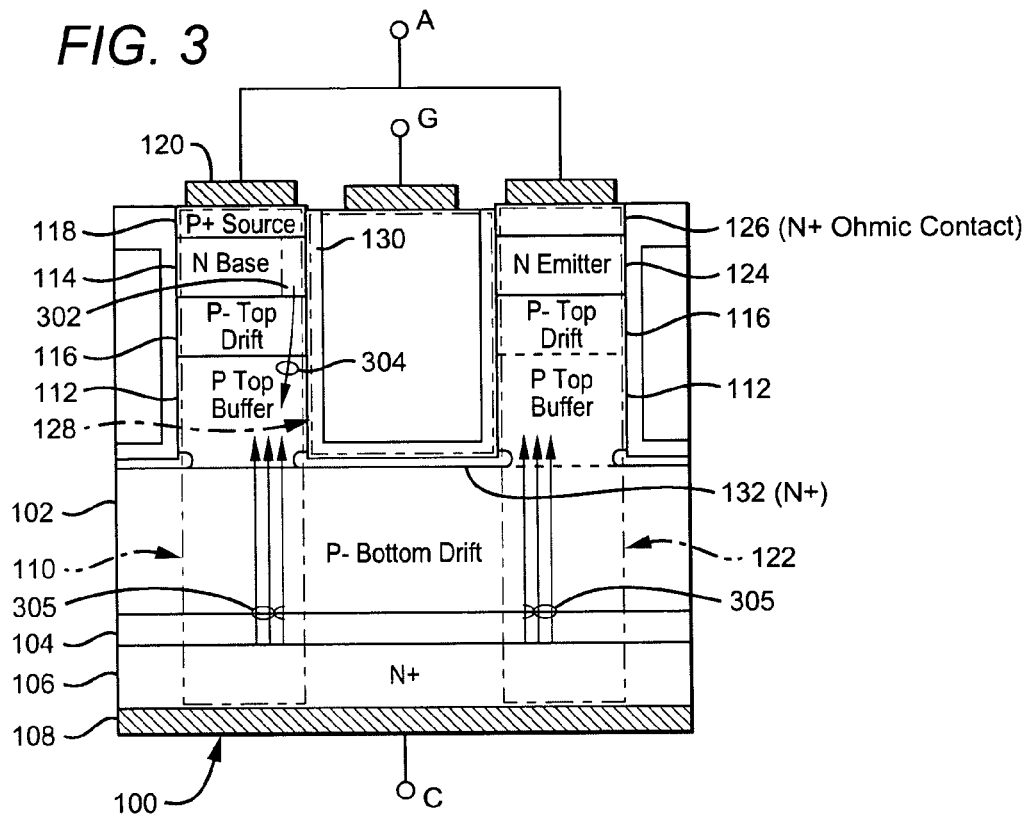

THYRISTOR SWITCH WITH TURN-OFF CURRENT SHUNT, AND OPERATING METHOD

RELATED APPLICATION

This is a continuation-in-part of Ser. No. 10/383,598 U.S. Pat. No. 6,965,131 filed Mar. 7, 2003.

BACKGROUND OF THE INVENTION

1. Field of the Invention

This invention relates to semiconductor switches, and particularly to high-power switches.

2. Description of the Related Art

Semiconductor switches are increasingly required to control large amounts of power while conforming to demanding power loss requirements. Such switches are typically used in motor control systems, uninterrupted power supplies, high-voltage DC transmission, induction heating, and many other high power applications.

Typical high power switches include gate turn-off thyristors (GTO), insulated-gate bipolar transistors (IGBTs) and accumulation field effect transistors (FETs). (See *The Electrical Engineering Handbook*, Richard C. Dorf, CRC Press, 1997, pp 763–769). GTOs are current control devices that suffer from high power dissipation in the gate drive during turn-off because the reverse gate current amplitude is dependent on the anode current to be turned-off. For example, a 2000 A peak current GTO may require as high as 500 A of reverse gate current. In high frequency megawatt systems, such high reverse gate current losses are undesirable. Also, forward voltage drops across silicon based GTOs utilized in a 6.5 Kv system may approach 5 volts. An IGBT device in a similar system may experience a forward voltage drop approaching 7 or 8 volts. Accumulation FETs suffer from complex fabrication processes, thus limiting their use to lab scale demonstration rather than commercial scale applications.

A need continues to exist for a high power switch with a lower forward voltage drop, lower power dissipation and simple gate-drive circuitry, that does not require complex fabrication processes.

SUMMARY OF THE INVENTION

A semiconductor switch is disclosed for use in high power circuits. It has a thyristor with a current shunt that shunts current away from the thyristor during turn-off to enable a rapid termination of thyristor regenerative action.

In one embodiment of the invention, the current shunt is implemented with a transistor that is connected in parallel with the thyristor and is turned on and off in response to the thyristor turning on and off, respectively, with the transistor lagging the thyristor in turning off and absorbing thyristor current to enable a very rapid thyristor turn-off. The thyristor includes a portion of a bottom drift layer with a light first polarity doping, and an insulated gate that terminates adjacent to the bottom drift layer. The transistor includes a second portion of the bottom drift layer as its base. The region below the gate is heavily doped to form a p-n junction with the bottom drift layer that establishes a high potential barrier to thyristor current flow during turn-off, allowing high current levels to be controlled.

BRIEF DESCRIPTION OF THE DRAWINGS

The components in the figures are not necessarily to scale, emphasis instead being placed upon illustrating the principals of the invention. Like reference numerals designate corresponding parts throughout the different views.

FIG. 3 is a cross-sectional view of the switch of FIG. 1 illustrating its operation during turn-on;

FIG. 4 is a cross-sectional view of the switch of FIG. 1, illustrating its operation during turn off;

DETAILED DESCRIPTION OF THE INVENTION

A semiconductor switch, in accordance with one embodiment of the invention, includes a thyristor with a current shunt that shunts current away from the thyristor during turn-off to enable a rapid termination of regenerative thyristor action. The switch achieves a low-forward-voltage drop in the on state. A high turn off current capability is achieved in the reverse-blocking mode using a MOS gate for voltage control. A plurality of such switches are disposed side-to-side with common anode, cathode and gate connections to obtain a desired current rating.

Figure 1:
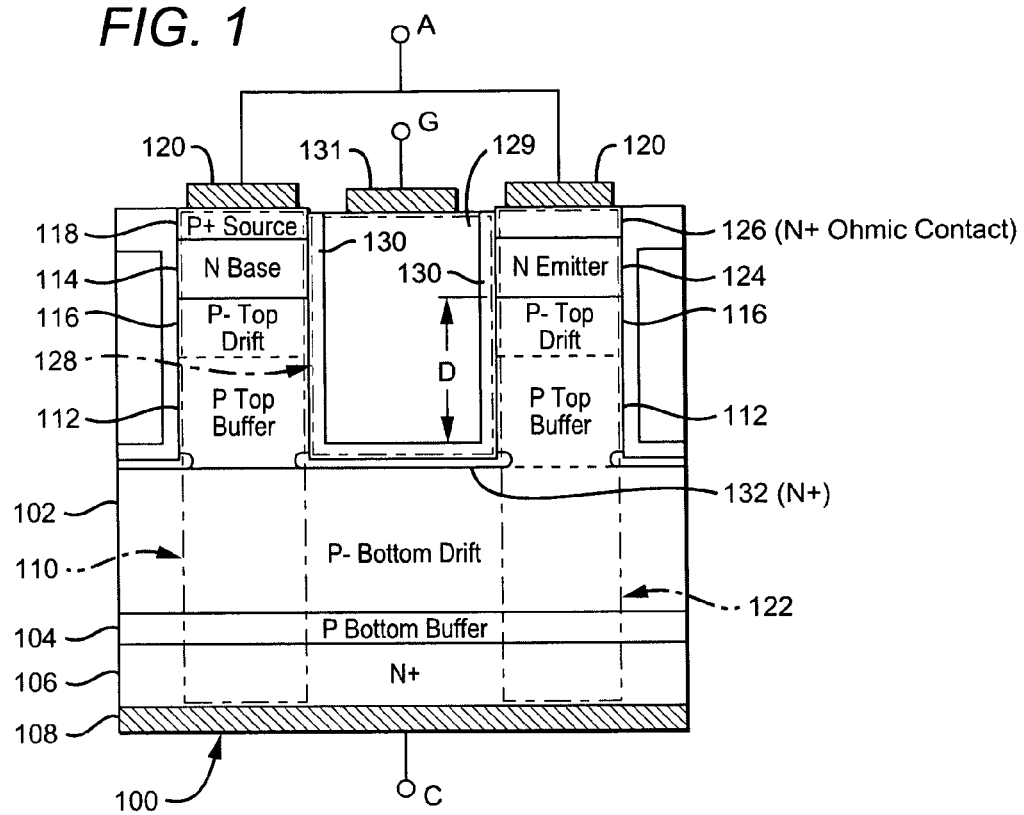
FIG. 1 is a cross-sectional view of a switch in accordance with one embodiment of the invention.

In one implementation of the invention shown in FIG. 1, a foundation for the switch 100 is formed from a P− bottom drift layer 102 on a P bottom buffer layer 104 which is on an N+ substrate region 106. The N+ substrate region 106 may be formed by ion implantation or diffusion. A cathode metal 108 contacts the substrate 106 to serve as the switch's cathode C. A thyristor 110 is defined by a portion of this PN junction base. A P top buffer layer 112 sits on the bottom drift layer 102 to reduce the turn-on threshold voltage. An N base layer 114 sits on either the top buffer layer 112 or on a P top drift layer 116 if the top buffer layer 112 does not extend all the way up to the N base layer 114. A P+ source layer 118 sits on the base layer 114. The thyristor 110 is thus described by a portion of the substrate, bottom buffer and bottom drift layers (106, 104, 102), the top buffer, base and source layers (112, 114, 118) and, preferably, the top drift layer 116 to form a thyristor with a PNPN doping structure. An anode A is connected to the source layer 118 via an anode metal 120.

A transistor 122 is defined by a second portion of the PN junction base (102, 104, 106). It also has two more layers including an N emitter layer 124 on the bottom drift layer 102 and an N+ ohmic contact layer 126 on the emitter layer 124. Or, either the P top buffer layer 112 or both the P top buffer and P− top drift layers (112, 116) may be formed in the transistor 122, as in the thyristor 110, to facilitate manufacturing when viewed in combination with the manufacture of the thyristor 110. Addition of the top buffer layer 112 would also increase switching speed of the switch 100. The transistor provides current shunting from the thyristor at switch turn-off. The anode A connects to the emitter layer 124 via the anode metal 120 on the ohmic contact layer 126.

The switch 100 includes a gate 128 that extends into the bottom drift layer 102 adjacent the transistor 122 to a depth D and separates the thyristor's source, base and top buffer layers (118, 114, 112) from the transistor's emitter and ohmic contact layers (124, 126). Additionally, if the top buffer 112 does not extend up to the base layer 114, then the gate 128 would also separate the top drift layer 116 from the transistor 122. The gate 128 includes a conductive material 129 with an upper surface generally planar with the upper surfaces of the source and ohmic contact layers (118, 126). It is insulated from the thyristor, transistor and underlying portion of the bottom drift layer (110, 122, 102) by an insulating layer 130 which extends across its bottom and up its sidewalls. The gate 128 completes a field-effect transistor (FET) when viewed in combination with the source, base, top drift, top buffer and bottom drift layers (118, 114, 116, 112 and 102) of the thyristor 110. Gate terminal G is connected to the gate 128 via a metal contact 131 on the conductive material 129.

A shallow N+ region ("switch-turn-off region") 132 is formed directly under the insulating layer 130 at the bottom of the gate 128 to produce a thick depletion region (see FIG. 4) when a positive voltage is applied to the gate contact G for device turn-off. The top buffer layer 112 extends down to a level either adjacent to the bottom of the shallow N+ region 132 or to approximately 1 micron above or below the bottom of the region 132.

The anode metal contact 120 is preferably Nickel or Nickel layered with Aluminum. The insulating layer 130 may be formed from either a thermal oxide, polyoxide, CVD oxide or a low temperature oxide. A metal or heavily doped polysilicon may also be used for the conductive material 129.

In one switch designed to provide a blocking voltage of 6.5 Kv between the Anode A and Cathode C, the insulating layer 130 is 0.05–0.2 microns thick and the various other elements of the switch have the approximate thicknesses, widths and carrier concentrations listed in Table 1.

TABLE 1

| | Thickness (microns) | Width (microns) | Carrier Concentration, Nd (cm$^{-3}$) |
|---|---|---|---|
| Cathode metal 108 | 0.3–0.5 | NA | NA |
| N+ substrate 106 | 0.5–400 | NA | $N_d > 5E17$ |
| P– Bottom drift layer 102 | 40–60 | NA | $2E14 < N_a < 8E14$ |
| Gate 128 | 4–10 | 2 | NA |
| Gate recess D | 2–8 | NA | NA |
| P Top buffer 112 | 0.5–D | 2 | $1E16 < N_a < 5E16$ |
| N base layer 114 | 1–2 | 2 | $1E16 < N_d < 2E17$ |
| P+ source layer 118 | 0.2–0.7 | 2 | $N_a > 5E17$ |
| Shallow N+ region (switch-turn-off region) 132 | 0.1–0.5 | 2 | $N_d > 5E17$ |
| N emitter layer 124 | 1–2 | 2 | $1E16 < N_d < 2E17$ |
| N+ ohmic contact layer 126 | 0.5 | 2 | $N_d > 5E17$ |

The body of the switch is formed from a semiconductor such as SiC, Si, or diamond that exhibits adequate usability and breakdown characteristics in high power applications.

The dopant types in the switch 100 described above may be reversed. For example, the N+ substrate layer 106 and P– bottom drift layer 102 may be doped P+ and N–, respectively. In the same implementation, the N base 114 and N emitter layer 124 would be P doped, and the P+ source layer 118, N+ ohmic contact layer 126 and P top buffer layer 112 would be doped N+, P+ and N respectively. If P– top drift layer is present between the base and top buffer layers (114, 112), it would be doped N–. Also, a switch designed for a higher blocking voltage would have a thicker bottom drift layer 102 with a lower doping concentration.

Figure 2:
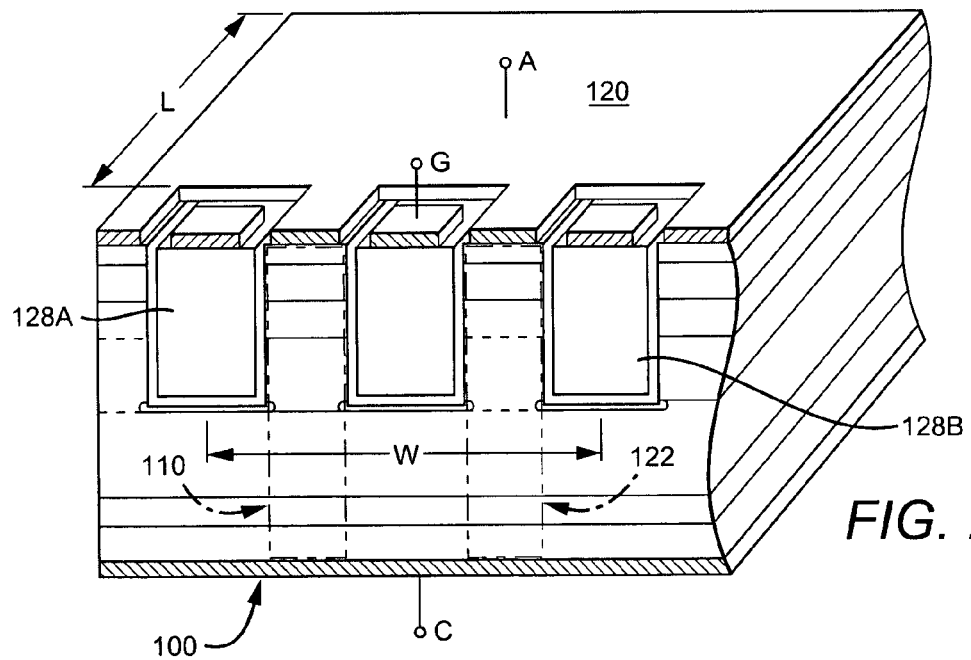
FIG. 2 is a perspective view of the switch of FIG. 1.

FIG. 2 is a perspective view of the switch as illustrated in FIG. 1. The switch 100, designed for a blocking voltage of 6.5 Kv and a current of 20 mA, has a width W and length L of 8 and 1000 microns, respectively. Many individual switches 100 can be provided side-by-side in a switch device (see FIG. 6) to allow for a desired current rating. FIG. 2 also shows a portion of adjacent gates (128A, 128B) used for adjacent switches. Typical switch devices can have 500–1000 thyristor and transistor pairs. The proportion of thyristors 110 to transistors 122 may be changed from 1:1 to 2:1 or 3:1 to allow for lower conduction loss at the expense of current turn-off capability. Similarly, the proportion may be changed from 1:1 to 1:2 or 1:3 to allow for higher current turn-off capability at the expense of conduction loss. The proportion of thyristor to transistor mesa width may be changed to allow for similar performance modification. For example, increasing the thyristor mesa width in comparison to the transistor mesa width would lower the forward conduction loss of the switch at the expense of current turn-off capability. Decreasing the thyristor mesa width in comparison to the transistor mesa width would allow for higher current turn-off capability at the expense of conduction loss.

FIG. 3 illustrates the current flow during turn-on for the switch of FIG. 1. A negative gate voltage $V_g$ is applied at the gate electrode G, preferably –15 volts with reference to the Anode A terminal, to begin a turn-on of the thyristor. Layers 118/114/116 initially function as a FET with a thin P-type inversion channel 302 created in the base layer 114 approximately 100 Angstroms thick, extending from the source layer 118, along and adjacent to the insulating layer 130, to either the top drift layer 116, if present, or to the top buffer layer 112. The P top buffer layer 112 reduces the effect of the depletion region created from the intersection of the N+ switch-turn-off region 132 and P– bottom drift layer 102 to reduce the turn-on voltage from what would otherwise exist with only the P– bottom drift layer 102. A limited current 304 flows through FET 118/114/116 into the base of NPN bipolar transistors 114/112/102/106 and 124/102/106, turning them on. This in turn induces a current flow 305 into the non-inverted portion of base layer 114, which provides the base current of upper PNP bipolar transistor 118/114/116/112, turning it on to provide a regenerative thyristor action to the thyristor 110. The thyristor 110 becomes latched on as more holes and more electrons flood the bottom drift layer 102, resulting in decreased resistance and increased current flow through the switch 100. The entire switch 100 is thus "on" between the anode A and cathode C, with the source layer 118 and ohmic contact layer 126 conducting approximately 75% and 25% of the total current flow, respectively, due to the lower resistance of the thyristor. The thyristor remains latched, keeping the transistor conductive, even if the gate voltage is removed. In this on-state, the switch 100 acts as a diode having a low forward voltage drop.

If the switch 100 is manufactured with an opposite doping conductivity to that shown in FIG. 1, a positive gate voltage is applied to turn it on and a negative voltage to turn it off.

FIG. 4 illustrates the turn-off operation for the switch 100. Upon application of a positive voltage at the gate electrode G, typically +15 V with reference to the Anode A terminal, for the parameters of Table 1, the P-type inversion channel 302 collapses and a depletion region 402 (reduced hole carriers) forms in the bottom drift layer 102 in the vicinity of gate 129, extending into the transistor 122 and into the top buffer layer 112 of the thyristor 110. If the top buffer layer is included in the transistor 122, then the depletion region 402 would also extend into it. If the top drift layer 116 is included in either or both of the thyristor or transistor (110, 122), the depletion region would extend into them as well. The gate voltage also reverse biases the PN junction defined by the shallow N+ switch-turn-off region 132 and the bottom drift layer 102 to extend the depletion region 402 vertically and horizontally further into the bottom drift layer 102. More particularly, the reverse biasing provides a thick depletion region in the bottom drift layer 102 to form a high potential barrier for holes to terminate the regenerative thyristor action to turn off the switch. For example, a 6.5 Kv switch, as described in Table 1 (including the N+ shallow switch turn-off region 132), allows turn-off of approximately 5,000 A/cm$^2$ at 3000 VAK (Anode-to-Cathode voltage). With-out the shallow N+ region 132, the switch's current turn off capability would be less than 100 A/cm$^2$ at 100 VAK. While the depletion region 402 extends through the top buffer and bottom drift layers (112, 102) lateral to the gate and top drift layer 116, if present, in these areas the potential barrier is lower than in the vicinity of the p-n junction. Extending the depth of the gate recess D would increase the potential barrier thickness thus enhancing switch's current turn-off capability, but would also result in a higher electric field at the trench corner and degrade reliability of the oxide 130.

With the depletion region 402 all the way across the thyristor's portion of the bottom drift layer 102, regenerative thyristor action is terminated very rapidly. A turn-off time of 10 nsec has been simulated. The transistor is then turned off as a result of the recombination of minority carriers. The turn-off time depends on the minority carrier lifetime, which in turn is a function of the dopant concentration, defects and impurities in the bottom drift layer 102 and the thickness and dopant concentration of the bottom buffer layer 104. A longer carrier lifetime leads to a slower turn off, while a shorter lifetime leads to a faster turn off. A higher dopant concentration in the bottom buffer layer 104 or introduction of more material defects throughout (due to implantation damage) would produce a shorter minority carrier life time, while decreasing the dopant concentration or limiting implantation damage would produce a longer minority carrier life time.

Figure 5:
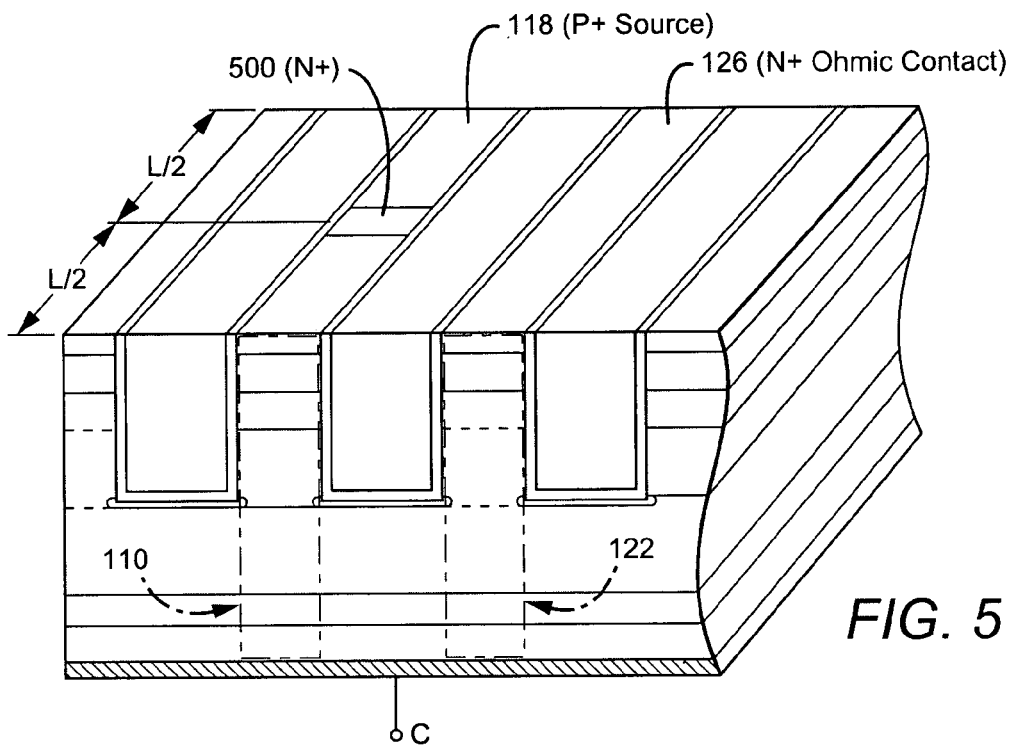
FIG. 5 is a perspective view of a second embodiment of the switch of FIG. 1.

FIG. 5 is a perspective view of one embodiment of the switch illustrated in FIG. 1. An N+ thyristor ohmic contact layer 500 is added to the thyristor 110 in place of a portion of the P+ source layer 118. In a switch having the dimensions listed in Table 1, the ohmic layer 500 has a thickness of 0.5 microns, a width of 2 microns, and a length of 2–10 microns. Its thickness and width are similar to the N+ ohmic contact layer 126 in the transistor mesa 110. Single or multiple additions are used, being spaced along the length L of the switch to shunt current from the remainder of the thyristor 110 during turn-off to enable a rapid termination of the thyristor regenerative action.

Figure 6:
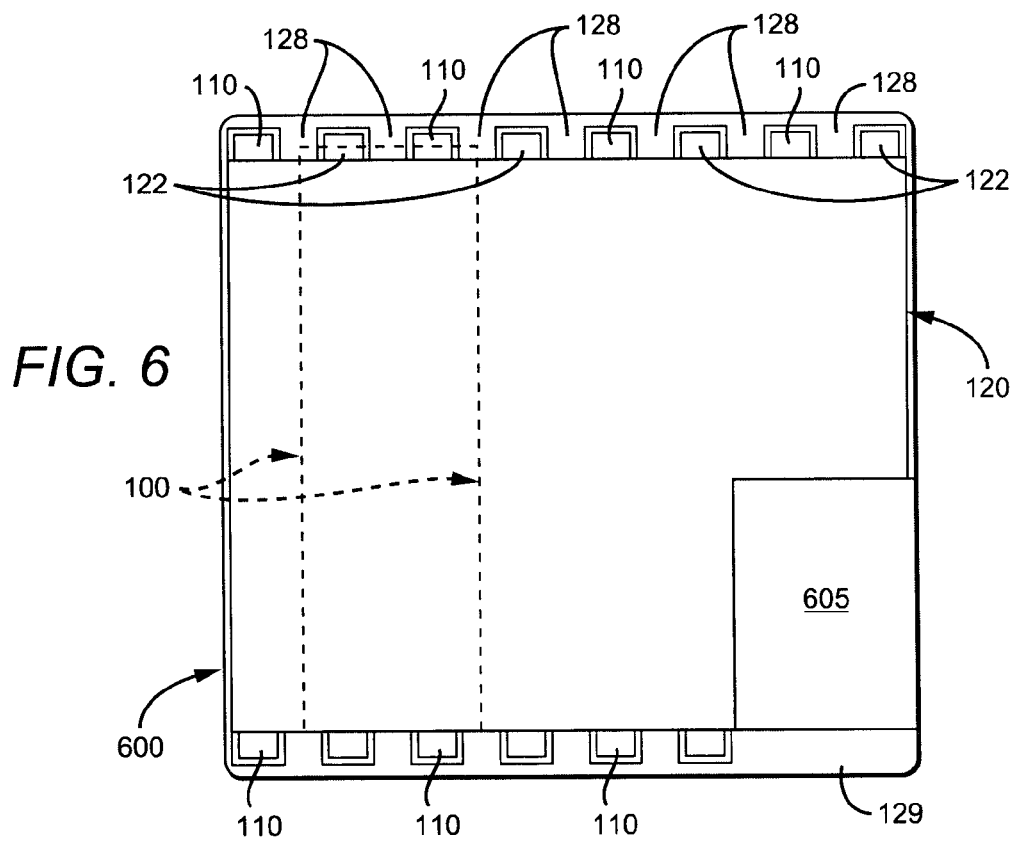
FIG. 6 is a plan view of a high-power switch utilizing a plurality of switches spaced side-to-side in accordance with one embodiment of the invention.

In one implementation of the invention shown in FIG. 6, many individual switches, such as the individual switch 100 illustrated in FIG. 1, are combined to form a single high-power switch 600 having a 1:1 ratio of thyristors and transistors (110, 122) interdigitated with gates 128. The anode metal 120 forms a sheet over the thyristor and transistor (110, 122). A common gate pad 605 is connected to the gates 128 through the conductive material 129. The cathode metal 108 is formed on the opposite side of the switch (not shown) to connect to the common cathode C (not shown). All of the individual switches are thus operated in parallel, providing a proportionately greater current capability than any individual switch. Although the switch 600 is shown with rectangular thyristors and transistors interdigitated with gates, the thyristors, transistors and gates may be interdigitated in other shapes. For example, they may form a circular, square, zig-zag, or spiraling pattern of interdigitated thyristors, transistors and gates.

While various implementations of the application have been described, it will be apparent to those of ordinary skill in the art that many more embodiments and implementations are possible that are within the scope of this invention.

I claim:

1. A semiconductor switch, comprising
a thyristor including top and bottom doped buffer layers, said top and bottom buffer layers each capable of supporting a depletion region and separated by a bottom drift layer; and
a current shunt which shunts current from said thyristor during turn-off to enable a rapid termination of thyristor regenerative action.

2. The semiconductor switch of claim 1, said thyristor including a base region, said switch further comprising a gate disposed adjacent to and insulated from said base region and said top buffer layer so that application of a voltage of a first polarity to said gate turns on said thyristor.

3. The semiconductor switch of claim 2, said thyristor including a top drift layer between said base region and said top buffer layer which reduces the thyristor resistance.

4. The semiconductor switch of claim 3, said switch further comprising a turn-off region heavily doped with a first polarity dopant under said gate which establishes a p-n junction with said bottom drift layer so that application of a turn-off bias voltage to said gate establishes a depletion region in said bottom drift and top buffer layers, said p-n junction having a potential barrier sufficient to cut off a rated thyristor current level.

5. The semiconductor switch of claim 1, wherein said current shunt includes said bottom drift layer having a light doping to provide a path for said shunted current.

6. The semiconductor switch of claim 1, said current shunt comprising a bipolar transistor whose conductive state is controlled by said thyristor.

7. The semiconductor switch of claim 6, wherein said bipolar transistor comprises:
a top buffer layer on said bottom drift layer to increase switching speed in said switch.

8. The semiconductor switch of claim 7, wherein said bipolar transistor further comprises:
a top drift layer on said top buffer layer.

9. The semiconductor switch of claim 6, wherein said bipolar transistor is turned off in response to said thyristor turning off.

10. The semiconductor switch of claim 9, said transistor having a longer turn-off time than said thyristor, and providing a transient shunt path for thyristor current when said thyristor turns off.

11. A semiconductor switch comprising:
a bottom drift layer with a light first polarity doping;
a thyristor which includes a first portion of said bottom drift layer and a top buffer layer on said first portion of said bottom drift layer, said top buffer layer having said first polarity doping;
a transistor which includes a second portion of said bottom drift layer;
an insulated gate adjacent to and controlling the operation of said thyristor, said thyristor controlling the operation of said transistor; and a switch turn-off region disposed below said insulated gate, said region having a heavy doping of an opposite polarity to said first polarity doping so that application of a first polarity voltage to said gate results in a depletion region extending through said thyristor to turn off the switch.

12. The semiconductor switch of claim 11, wherein said bottom drift layer is on a bottom buffer layer having said first polarity doping, and said bottom buffer layer is on a substrate having a heavy opposite polarity doping so that, when a turn-on voltage is applied to said gate, said bottom buffer layer reduces the number of minority carriers in said bottom drift layer to reduce turn-off time of said switch.

13. The semiconductor switch of claim 11, said thyristor further comprising a base layer having an opposite polarity doping, and a source layer having said first polarity doping on said base layer so that an inversion channel is created in said base layer adjacent to said gate when a turn-on voltage is applied to said gate.

14. The semiconductor switch of claim 11, wherein said insulated gate spans between about 4 and 10 microns along said thyristor.

15. A semiconductor switch, comprising:
a substrate region having a heavy doping of a first polarity;
a bottom buffer layer on said substrate region having a doping of a polarity opposite to said first polarity;
a bottom drift layer on said bottom buffer layer having a light doping of said opposite polarity;
a thyristor formed from a first portion of said substrate region, a first portion of said bottom buffer layer and a first portion of said bottom drift layered and further including:

a top buffer layer of said opposite polarity on said bottom drift layer first portion;
a base layer having a doping of said first polarity coupled to said top buffer layer; and
a source layer having a heavy doping of said opposite polarity on said base layer;
a transistor formed from a second portion of said substrate region, a second portion of said bottom buffer layer and a second portion of said bottom drift layer and further comprising an emitter layer having a doping of said first polarity on said bottom drift layer second portion;
a gate sandwiched between said transistor and thyristor and insulated from each by an insulating layer; and
a switch-turn-off region having a heavy doping of said first polarity between said insulating layer and said drift layer and disposed substantially under said gate;
wherein a voltage applied to said gate causes an inversion channel to form in said base layer and adjacent to said gate to allow current injection from said source layer to said bottom drift layer to turn on said thyristor and transistor.

16. The semiconductor switch of claim 15, wherein said switch-turn-off region is approximately 0.5 microns thick.

17. The semiconductor switch of claim 15, wherein said gate extends approximately 4–10 microns from a top of said source layer towards said bottom drift layer.

18. The semiconductor switch of claim 15, said thyristor further comprising:
a top drift layer coupling said base layer to said top buffer layer.

* * * * *

UNITED STATES PATENT AND TRADEMARK OFFICE
CERTIFICATE OF CORRECTION

PATENT NO. : 7,173,290 B2
APPLICATION NO. : 10/642085
DATED : February 6, 2007
INVENTOR(S) : Hsueh-Rong Chang It is certified that error appears in the above-identified patent and that said Letters Patent is hereby corrected as shown below:

In column 1, line 10 (following the title and preceding the heading "Background of the Invention"), the following government rights statement should be inserted:

-- This invention was made with Government support under Contract N00014-99-3-0006 awarded by the U.S. Navy, Office of Naval Research. The Government has certain rights in this invention. --

Signed and Sealed this

Thirtieth Day of December, 2008

JON W. DUDAS
*Director of the United States Patent and Trademark Office*